United States Patent
Kuo et al.

(10) Patent No.: US 8,821,004 B2
(45) Date of Patent: Sep. 2, 2014

(54) FLAT PANEL DISPLAY DEVICE, STEREOSCOPIC DISPLAY DEVICE, AND PLASMA DISPLAY DEVICE

(75) Inventors: Yi-Cheng Kuo, Shenzhen (CN); Yu-Chun Hsiao, Shenzhen (CN); Chong Huang, Shenzhen (CN); Jia-He Cheng, Shenzhen (CN); Cheng-Wen Que, Shenzhen (CN); Quan Li, Shenzhen (CN); Liu-Yang Yang, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 93 days.

(21) Appl. No.: 13/381,797

(22) PCT Filed: Nov. 23, 2011

(86) PCT No.: PCT/CN2011/082682
§ 371 (c)(1),
(2), (4) Date: Dec. 30, 2011

(87) PCT Pub. No.: WO2013/071555
PCT Pub. Date: May 23, 2013

(65) Prior Publication Data
US 2013/0128534 A1    May 23, 2013

(30) Foreign Application Priority Data

Nov. 18, 2011 (CN) .......................... 2011 1 0367087

(51) Int. Cl.
*F21V 7/04*   (2006.01)
*G09F 13/04*  (2006.01)
(Continued)

(52) U.S. Cl.
CPC *G09F 13/04* (2013.01); *H05K 5/00* (2013.01); *G02F 1/1333* (2013.01)
USPC ......... 362/633; 362/632; 362/97.1; 362/97.3; 361/807; 361/810

(58) Field of Classification Search
USPC .............. 362/632, 633, 634, 97.1, 97.2, 97.3, 362/97.4; 361/683, 807, 810
See application file for complete search history.

(56) References Cited

U.S. PATENT DOCUMENTS 7,697,086 B2 * 4/2010 Yang et al. ...................... 349/58
7,843,525 B2 * 11/2010 Tsumura et al. ................ 349/58
(Continued)

FOREIGN PATENT DOCUMENTS

CN    1662124 A    8/2005
CN    1912690 A    2/2007
(Continued)

OTHER PUBLICATIONS

"Sanyo Electric Co. & Tokyo Sanyo Electric Co.", JP 2004-251931A, Sep. 9, 2004, machine translation.*

*Primary Examiner* — Ismael Negron
*Assistant Examiner* — William N Harris
(74) *Attorney, Agent, or Firm* — Cheng-Ju Chiang

(57) ABSTRACT

A flat panel display device includes a backlight system and a display panel, wherein: the backlight system includes a light source, a light homogenization mechanism, and a back frame; the back frame carries the light source and the light homogenization mechanism and the back frame includes at least first and second primary assembling pieces, wherein the first primary assembling piece has an end forming at least two joint sections, each of the joint sections having a structure mating an end of the second primary assembling piece, the first primary assembling piece using one of the joint sections to join the corresponding end of the second primary assembling piece. The back frame further includes secondary assembling pieces. The primary assembling pieces and/or the secondary assembling pieces form bumps. A stereoscopic display device and a plasma display device are also provided.

18 Claims, 9 Drawing Sheets

(51) Int. Cl.
*G09F 13/08* (2006.01)
*H05K 7/02* (2006.01)
*H05K 7/04* (2006.01)
*H05K 5/00* (2006.01)
*G02F 1/1333* (2006.01)

(56) References Cited

U.S. PATENT DOCUMENTS

2005/0168954 A1* 8/2005 Kim .............................. 361/725
2009/0262554 A1* 10/2009 Lee et al. ....................... 362/633
2011/0043719 A1* 2/2011 Thunhorst et al. ............. 349/58
2011/0193800 A1* 8/2011 Son et al. ....................... 345/173

FOREIGN PATENT DOCUMENTS

| CN | 201075299 Y | 6/2008 |
| CN | 101281319 A | 10/2008 |
| CN | 101299308 A | 11/2008 |
| CN | 201672468 U | 12/2010 |
| CN | 201757332 U | 3/2011 |
| CN | 202002026 U | 10/2011 |
| CN | 102243402 A | 11/2011 |
| CN | 102392993 A | 3/2012 |
| JP | 2004-251931 A | 9/2004 |

* cited by examiner

FLAT PANEL DISPLAY DEVICE, STEREOSCOPIC DISPLAY DEVICE, AND PLASMA DISPLAY DEVICE

BACKGROUND OF THE INVENTION

1. Field of the Invention

The present invention relates to the field of displaying techniques, and in particular to a flat panel display device, a stereoscopic display device, and a plasma display device.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

Referring to FIG. 20, FIG. 20 is a schematic view showing a conventional backlight system. The backlight system 51 comprises a light source 55, a light homogenization mechanism 54, and a back frame 53. The back frame 54 carries the light source 55 and the light homogenization mechanism 54. The light homogenization mechanism 54 and the light source 55 are directly positioned on an upper surface of the back frame 53. This makes the light homogenization mechanism 54 not well supported and may thus lead to instability of the whole backlight system 51.

SUMMARY OF THE INVENTION

The technical issue to be addressed by the present invention is to provide a flat panel display device, a stereoscopic display device, and a plasma display device, which allow a light homogenization mechanism to be well supported and make the backlight system more stable.

To address the above technical issue, the present invention adopts a technical solution that provides a flat panel display device. The flat panel display device comprises a backlight system and a display panel, wherein: the backlight system comprises a light source, a light homogenization mechanism, and a back frame; the back frame carries the light source and the light homogenization mechanism and the back frame comprises at least first and second primary assembling pieces, wherein the first primary assembling piece has an end forming at least two joint sections, each of the joint sections having a structure mating an end of the second primary assembling piece, the first primary assembling piece using one of the joint sections to join the corresponding end of the second primary assembling piece, the at least two primary assembling pieces being joined to form a main frame structure of the back frame, the back frame further comprising secondary assembling pieces that are arranged inside the main frame structure, the secondary assembling pieces being joined to the main frame structure, the primary assembling pieces and/or the secondary assembling pieces forming bumps, the bumps supporting a light homogenization mechanism.

Wherein, the first primary assembling piece has an end forming at least two joint sections, each of the joint sections having a structure mating an end of the second primary assembling piece, the first primary assembling piece using one of the joint sections to join the corresponding end of the second primary assembling piece.

Wherein, the at least two joint sections are arranged to space from each other in a lengthwise direction of the first primary assembling piece.

Wherein, the joint sections comprise recesses formed in a surface of the first primary assembling piece and having a shape corresponding to the end of the second primary assembling piece for receiving the end of the second primary assembling piece.

Wherein, the joint sections comprise recesses formed in a surface of the first primary assembling piece, the second primary assembling piece having a surface forming protrusions at corresponding positions, the protrusions being receivable in the recesses to join the first primary assembling piece and the second primary assembling piece to each other.

Wherein, the second primary assembling piece has an end forming at least two protrusions that are arranged to space from each other in a lengthwise direction of the second primary assembling piece.

Wherein, the recess comprises a polygonal recess and the protrusion is shaped as a corresponding polygonal protrusion.

Wherein, the recess of the first primary assembling piece forms in a bottom thereof a first through hole, the second primary assembling piece forming in a corresponding location a second through hole, the back frame comprising a fastener, the fastener extending through the first through hole and the second through hole to join the first primary assembling piece and the second primary assembling piece to each other.

Wherein, the back frame comprises a third primary assembling piece and a fourth primary assembling piece; and the first primary assembling piece, the second primary assembling piece, the third primary assembling piece, and the fourth primary assembling piece are straight linear and are joined to each other in a leading end-to-tailing end manner to form a main frame structure enclosing the back frame.

Wherein, the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

Wherein, primary assembling piece and the third primary assembling piece have surfaces forming, in an equally-spaced manner, at least two of the bumps, the bumps of the first primary assembling piece and the second primary assembling piece being arranged symmetric.

Wherein, secondary assembling pieces have surfaces forming, in an equally-spaced manner, at least two of the bumps, the bumps of the first secondary assembling piece and the second secondary assembling piece being arranged symmetric.

Wherein, the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

Wherein, the second primary assembling piece, the fourth primary assembling piece, the first secondary assembling piece, and the second secondary assembling piece are arranged parallel to each other.

Wherein, the flat panel display device comprises a touch screen and the touch screen is positioned on a light exit surface of the display panel.

To address the above technical issue, the present invention adopts a technical solution that provides a stereoscopic display device. The stereoscopic display device comprises a liquid crystal lens grating, a backlight system, and a display panel, the liquid crystal lens grating being arranged on a light exit surface of the display panel; the backlight system comprises a light source, a light homogenization mechanism, and a back frame; the back frame carries the light source and the light homogenization mechanism, the light homogenization mechanism guiding light from the light source to a light incidence surface of the display panel; the back frame comprises at least first and second primary assembling pieces, wherein the first primary assembling piece has an end forming at least two joint sections, each of the joint sections having a structure mating an end of the second primary assembling piece, the at least two primary assembling pieces being joined to form a main frame structure of the back frame, the back frame further comprising secondary assembling pieces that are arranged inside the main frame structure, the secondary assembling pieces being joined to the main frame structure, the primary assembling pieces and/or the secondary assembling pieces forming bumps, the bumps supporting a light homogenization mechanism.

Wherein, the primary assembling pieces comprise a first primary assembling piece, a second primary assembling piece, a third primary assembling piece, and a fourth primary assembling piece; and the first primary assembling piece, the second primary assembling piece, the third primary assembling piece, and the fourth primary assembling piece are jointed to form a main frame structure of the back frame.

To address the above technical issue, the present invention adopts a technical solution that provides a plasma display device, which comprises a plasma display panel and a back frame, the back frame being arranged at a back side of the plasma display panel; the back frame comprises at least first and second primary assembling pieces, wherein the first primary assembling piece has an end forming at least two joint sections, each of the joint sections having a structure mating an end of the second primary assembling piece, the at least two primary assembling pieces being joined to form a main frame structure of the back frame, the back frame further comprising secondary assembling pieces that are arranged inside the main frame structure, the secondary assembling pieces being joined to the main frame structure, the primary assembling pieces and/or the secondary assembling pieces forming bumps, the bumps supporting a light homogenization mechanism.

Wherein, the primary assembling pieces comprise a first primary assembling piece, a second primary assembling piece, a third primary assembling piece, and a fourth primary assembling piece; and the first primary assembling piece, the second primary assembling piece, the third primary assembling piece, and the fourth primary assembling piece are jointed to form a main frame structure of the back frame.

The efficacy of the present invention is that to be distinguished from the state of the art, the present invention provides a flat panel display device, a stereoscopic display device, and a plasma display device that comprise at least two primary assembling pieces joined to form a main frame structure of the back frame. Secondary assembling pieces are provided in the main frame structure. Bumps are formed on the primary assembling pieces and/or the secondary assembling pieces to have the back frame firmly support the light homogenization mechanism and making the structure of backlight system more stable.

DETAILED DESCRIPTION OF THE PREFERRED EMBODIMENTS

Figure 1:
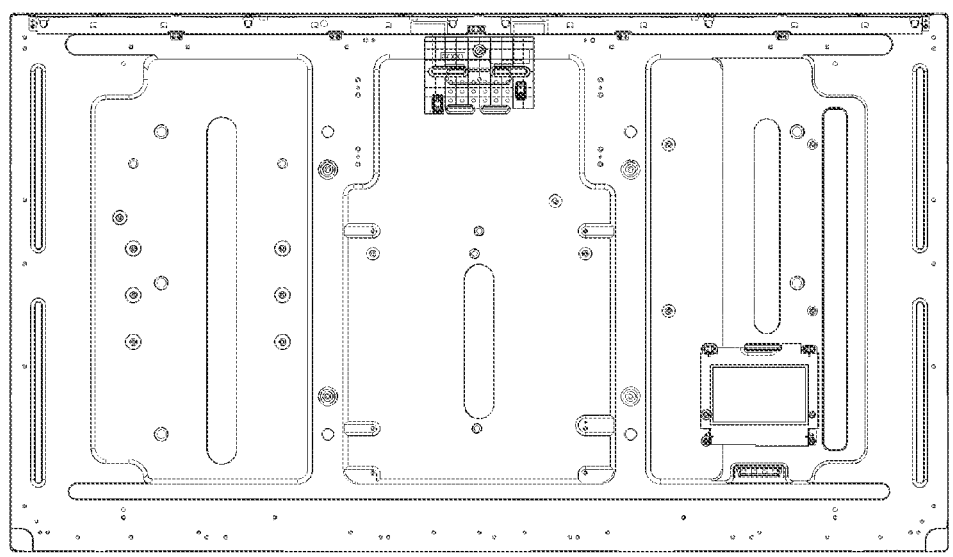
FIG. 1 is a schematic view showing a conventional back frame of liquid crystal display device.
Figure 2:
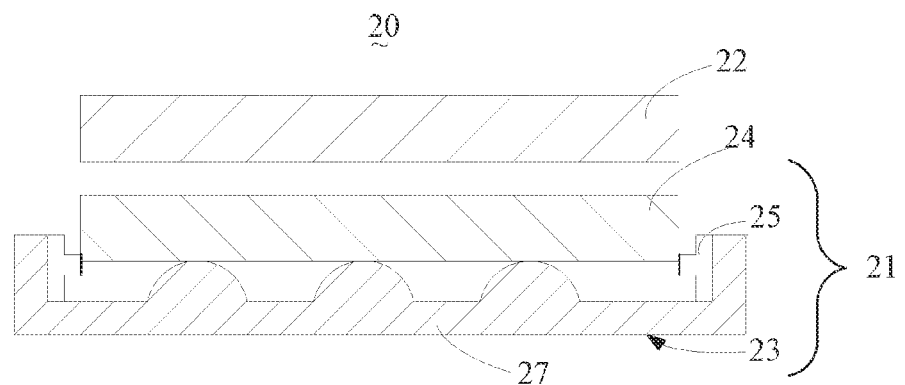
FIG. 2 is a schematic view showing a first embodiment of a flat panel display device according to the present invention.
Figure 3:
FIG. 3 is a schematic view showing a first embodiment of a back frame of flat panel display device according to the present invention.

Referring to FIGS. 2-3, FIG. 2 is a schematic view showing a flat panel display device according to a first embodiment of the present invention and FIG. 3 is a schematic view showing a first embodiment of a back frame of flat panel display device according to the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. The back frame 23 forms raised bumps and the light homogenization mechanism 24 is positioned on the bumps. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least a first and second primary assembling pieces constitute a main frame structure 27 of the back frame 23.

Referring also to FIG. 3, the back frame of the first embodiment, which is now designated at 26, comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure of the back frame 26. The first primary assembling piece 261 and the second primary assembling piece 262 are both aluminum pieces or galvanized steel pieces. In the instant embodiment, the first primary assembling piece 261 and the second primary assembling piece 262 are L-shaped.

Figure 4:
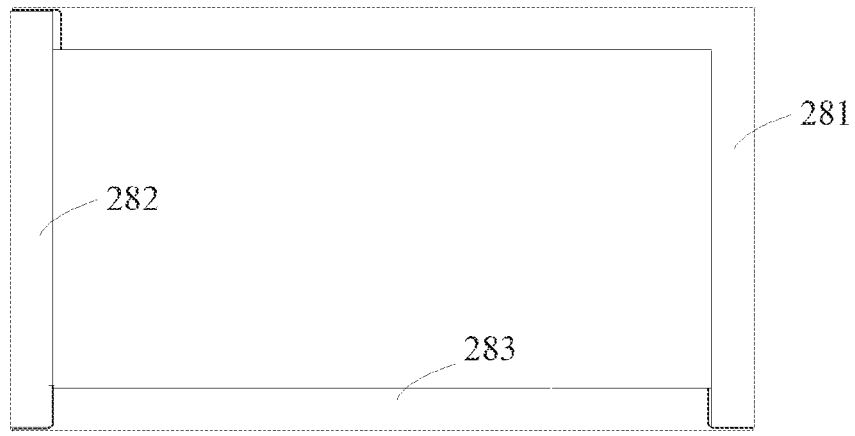
FIG. 4 is a schematic view showing a second embodiment of a back frame of flat panel display device according to the present invention.

Referring also to FIG. 4, the back frame of a second embodiment, which is designated at 28, comprises a first primary assembling piece 281, a second primary assembling piece 282, and a third primary assembling piece 283. The three primary assembling pieces 281, 282, and 283 are assembled and joined to form a main frame structure of the back frame 28. The three primary assembling pieces 281, 282, and 283 are all aluminum pieces or galvanized steel pieces. In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 5:
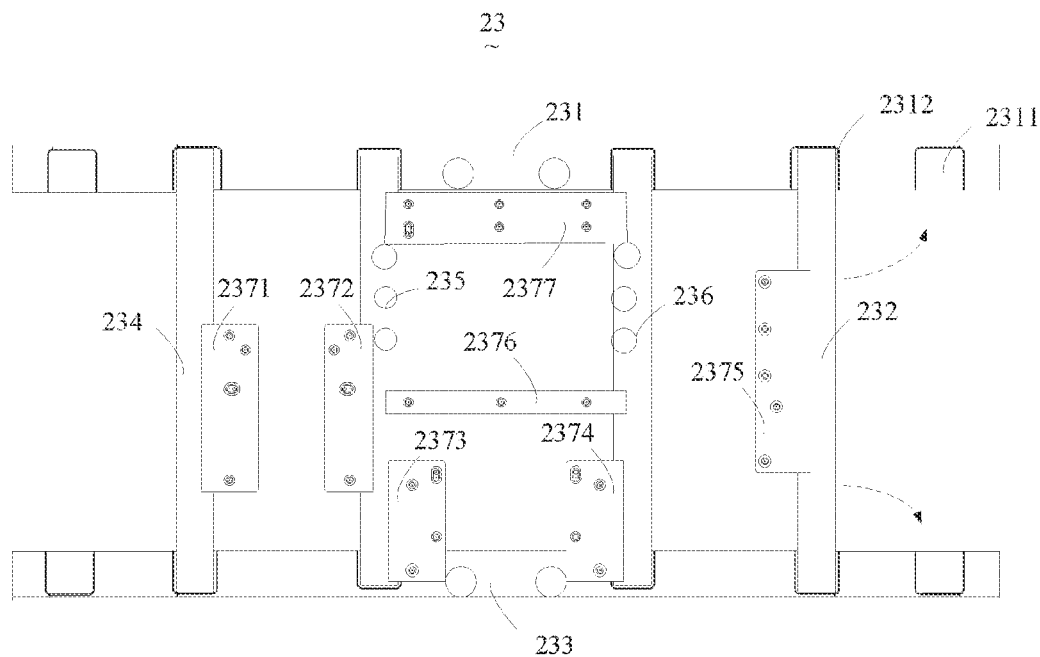
FIG. 5 is a schematic view showing a third embodiment of a back frame of flat panel display device according to the present invention.

Referring to FIG. 5, FIG. 5 is a schematic view showing a third embodiment of a back frame of a flat panel display device according to the present invention. As shown in FIG. 5, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are joined to each other in a leading end-to-tailing end manner to constitute a main frame structure of the back frame 23. The first secondary assembling piece 235 and the second secondary assembling piece 236, serving as ancillary assembling pieces, are arranged in the main frame structure and joined to the main frame structure. The first primary assembling piece 231, the third primary assembling piece 233, the first secondary assembling piece 235, and the second secondary assembling piece 236 form bumps thereon.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 6:
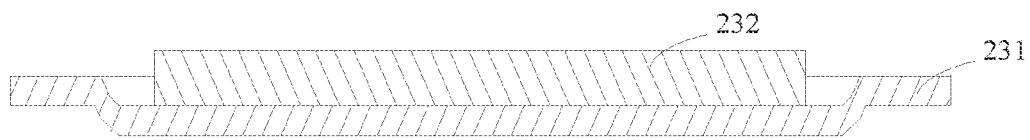
FIG. 6 is a schematic view showing a joining arrangement of a first embodiment of a flat panel display device according to the present invention.

In the instant embodiment, the back frame 23 of the flat panel display device 20 is formed by joining connection. As shown in FIG. 6, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 7:
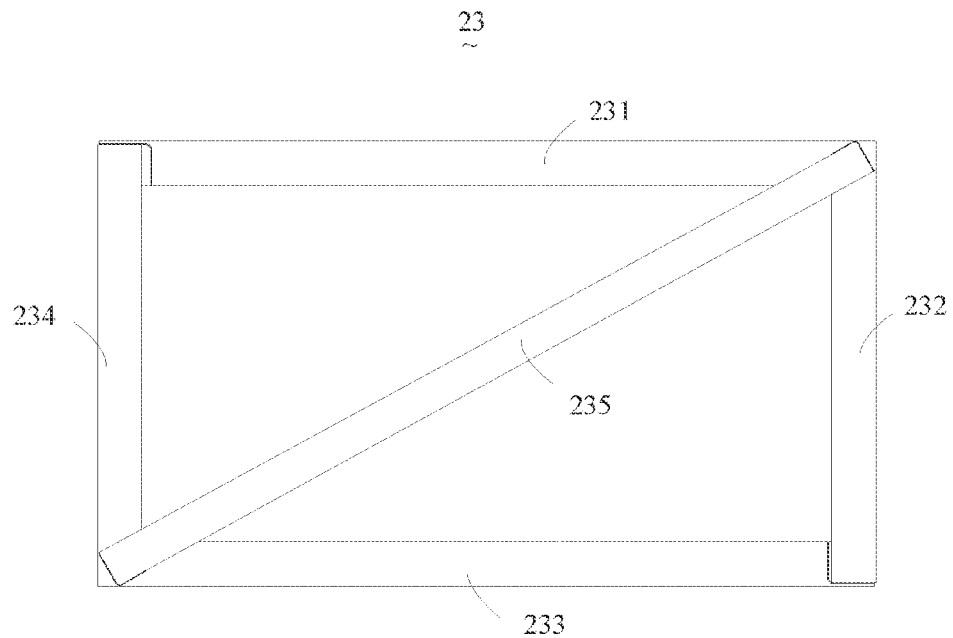
FIG. 7 is a schematic view showing a diagonally-arranged first secondary assembling piece mounted to a main frame structure of a second embodiment of a flat panel display device according to the present invention.
Figure 8:
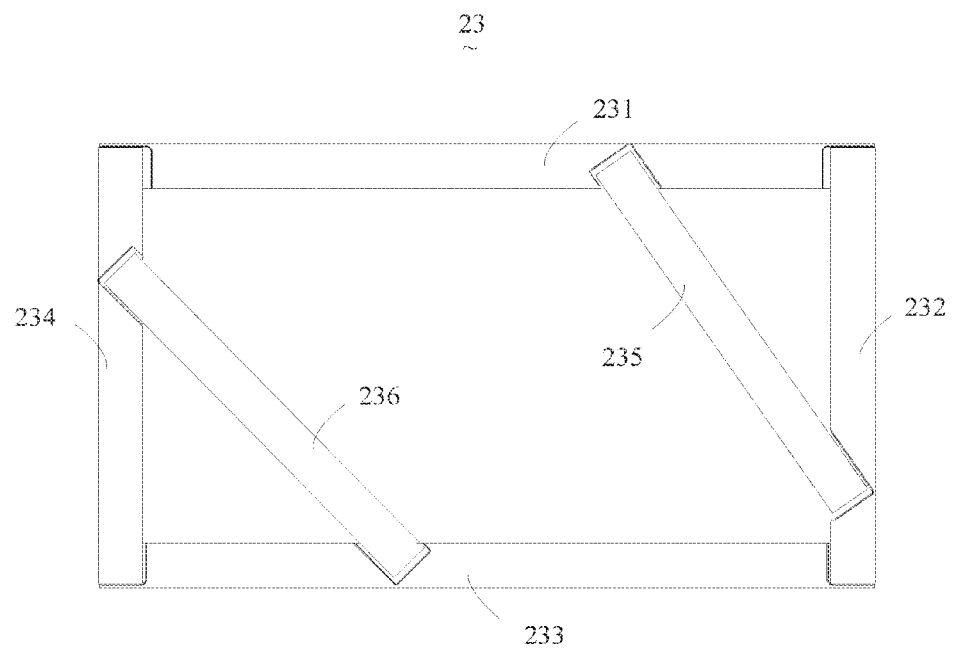
FIG. 8 is a schematic view showing a first secondary assembling piece and a second secondary assembling piece mounted to a main frame structure of a third embodiment of a flat panel display device according to the present invention.

In the instant embodiment, the first secondary assembling piece 235 and the second secondary assembling piece 236 are arranged in the main frame structure of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure. For example, only the first secondary assembling piece 235 is arranged in the main frame structure. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other, as shown in FIG. 8.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 9:
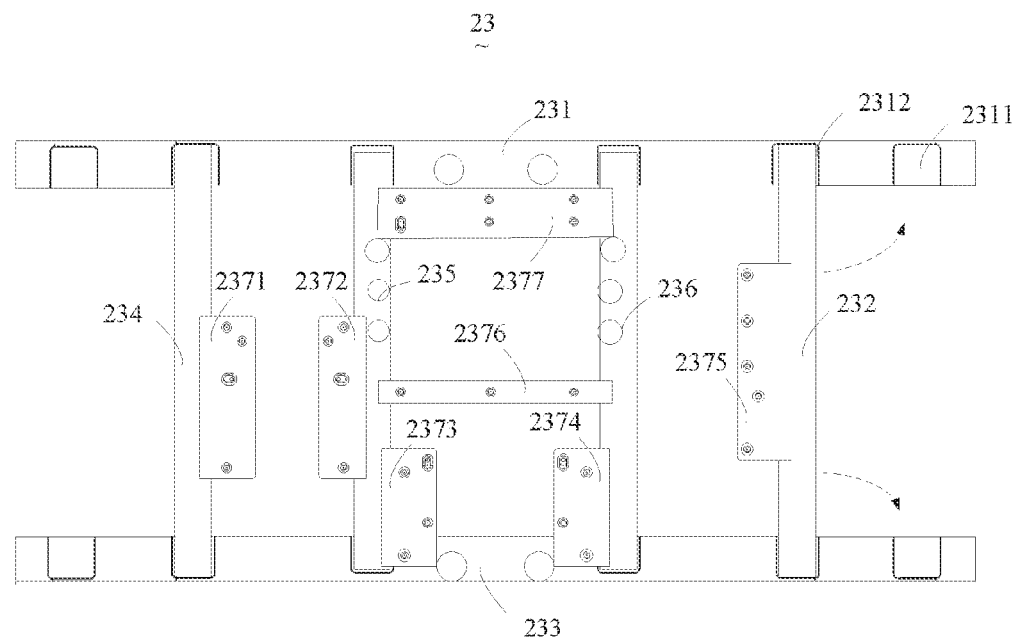
FIG. 9 is a schematic view showing a first embodiment of joint sections of a back frame of flat panel display device according to the present invention.

Referring to FIG. 9, FIG. 9 is a schematic view showing a first embodiment of joint sections of a back frame of flat panel display device according to the present invention. As shown in FIG. 9, in the instant embodiment, an end of the first primary assembling piece is provided with two joint sections, and the joint sections have a structure mating an end of the second primary assembling piece so that the first primary assembling piece can be joined to a corresponding end of the second primary assembling piece. The first primary assembling piece 231, the third primary assembling piece 233, the first secondary assembling piece 235, and the second secondary assembling piece 236 form bumps thereon.

Figure 10:
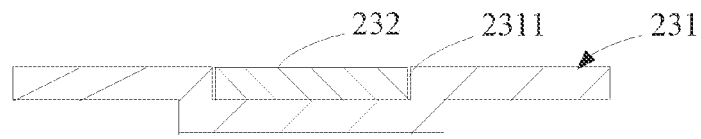
FIG. 10 is a cross-sectional view showing the first embodiment of the joint section of FIG. 9.

Specifically, the first primary assembling piece 231 has an end forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein. As shown in FIG. 10, the joint sections 2311, 2312 are recesses that do not extend through opposite surfaces of the end of the first primary assembling piece 231 and the recesses are of a rectangular shape with the second primary assembling piece 232 being straight linear.

Figure 11:
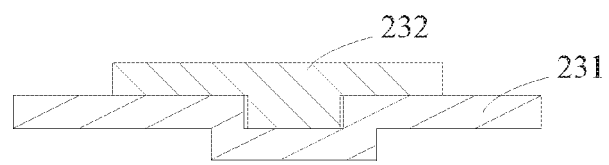
FIG. 11 is a schematic view showing a second embodiment of a joining arrangement of a joint section of a back frame of a flat panel display device according to the present invention.
Figure 12:
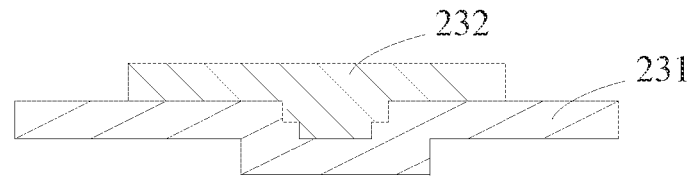
FIG. 12 is a schematic view showing a third embodiment of a joining arrangement of a joint section of a back frame of a flat panel display device according to the present invention.
Figure 13:
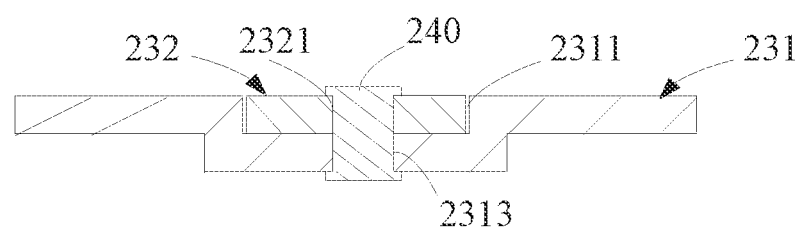
FIG. 13 is a schematic view showing a fourth embodiment of a joining arrangement of a joint section of a back frame of a flat panel display device according to the present invention.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312. Specifically, for example the second primary assembling piece 232 forms a protrusion at a corresponding location on a surface thereof, and the protrusion of the second primary assembling piece 232 is embedded in the recess the first primary assembling piece 231 at a corresponding location in order to join the first primary assembling piece 231 and the second primary assembling piece 232, as shown in FIG. 11. Furthermore, the recess of the first primary assembling piece 231 can be a recess of a multi-stepped configuration and the second primary assembling piece 232 forms, at a corresponding location, a protrusion having a multi-stepped configuration corresponding to the recess, as shown in FIG. 12. Further, as shown in FIG. 13, taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 14:
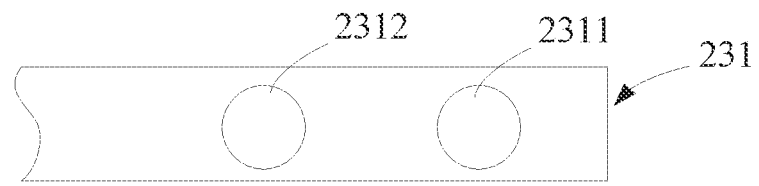
FIG. 14 is a schematic view showing a second embodiment of joint sections of a back frame of flat panel display device according to the present invention.

As shown in FIG. 14, in another embodiment of the back frame of flat panel display device according to the present invention, the recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 15:
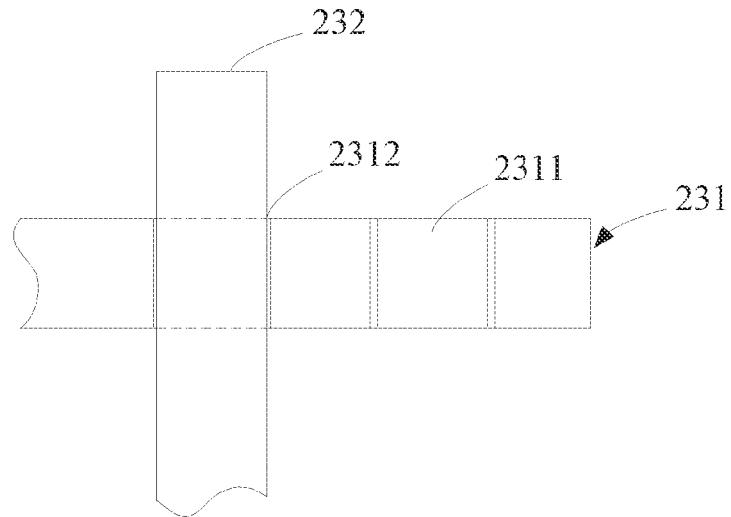
FIG. 15 is a schematic view showing a third embodiment of joint sections of a back frame of flat panel display device according to the present invention.

As shown in FIG. 15, in another embodiment of the back frame of flat panel display device according to the present invention, the joint sections 2311, 2312 are recesses that do not extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted.

In a practical application, the other end of the first primary assembling piece 231 and both ends of the third primary assembling piece 233 are all provided with two joint sections having a structure identical to that of the joint sections 2311, 2312. The ends of the second primary assembling piece 232 and the ends of the fourth primary assembling piece 234 may be subjected to specific designs or no design at all according to the application. For example:

(1) In a first situation, as shown in FIG. 10, the two ends of the second primary assembling piece 232 and the two ends of the fourth primary assembling piece 234 are of no specific design. In other words, the ends are of the same structure as the remaining portions. Under this condition, in making a join with a selected joint section 2311 (2312) at one end of the first primary assembling piece 231 (the same applicable to the other end), if an attempt is made to change the width of the back frame 23, then the length of the corresponding second primary assembling piece 232 and fourth primary assembling piece 234 must be selected accordingly. Namely, if the joint section 2311 that is close to the very end of the first primary assembling piece 231 is selected for joining, then no trimming is applied to the second primary assembling piece 232 and the fourth primary assembling piece 234 or the portion that is trimmed off is short; if the joint section 2312 that is distant from the very end of the first primary assembling piece 231 is selected for joining, then the second primary assembling piece 232 and the fourth primary assembling piece 234 are trimmed and the trimmed portion being long or short is according to the distance that the joint section is from the very end of the first primary assembling piece 231 being great or small; and (2) In a second situation, it is similar to the first situation, but as shown in FIG. 11, the second primary assembling piece 232 and the fourth primary assembling piece 234 use different protrusions to respectively mate the first primary assembling piece 231 and the third primary assembling piece 233 in order to realize change of width of the back frame 23; similarly, if a joint section 2312 other than the first joint section 2311 that is close to the very end of the first primary assembling piece 231 is selected for joining, then before or after joining, excessive portions of the second primary assembling piece 232 and the fourth primary assembling piece 234 may be trimmed off.

This also applicable to a main frame structure 27 of the back frame 23 that is formed by joining two L-shaped primary assembling pieces.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Figure 16:
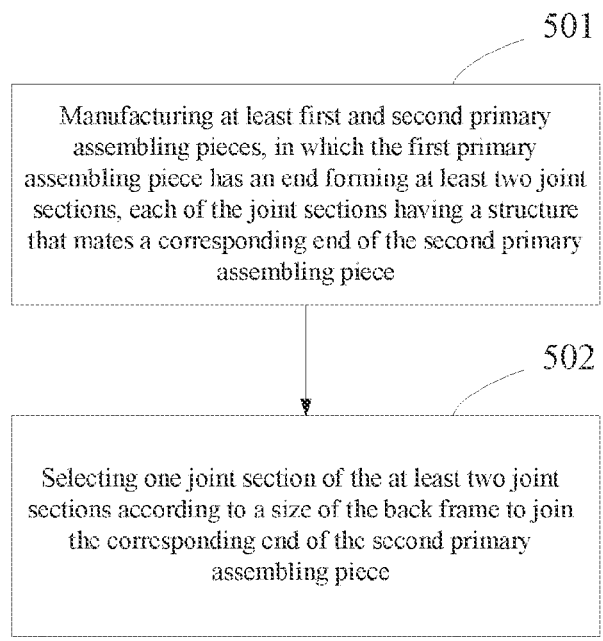
FIG. 16 is a flow chart showing a preferred embodiment of a method for manufacturing a back frame of a flat panel display device according to the present invention.

As shown in FIG. 16, the present invention also provides a method for making a back frame of flat panel display device. The method comprises the following steps:

Step 501: manufacturing at least first and second primary assembling pieces, in which the first primary assembling piece has an end forming at least two joint sections, each of the joint sections having a structure that mates a corresponding end of the second primary assembling piece; and Step 502: selecting one joint section of the at least two joint sections according to a size of the back frame to join the corresponding end of the second primary assembling piece.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

Figure 17:
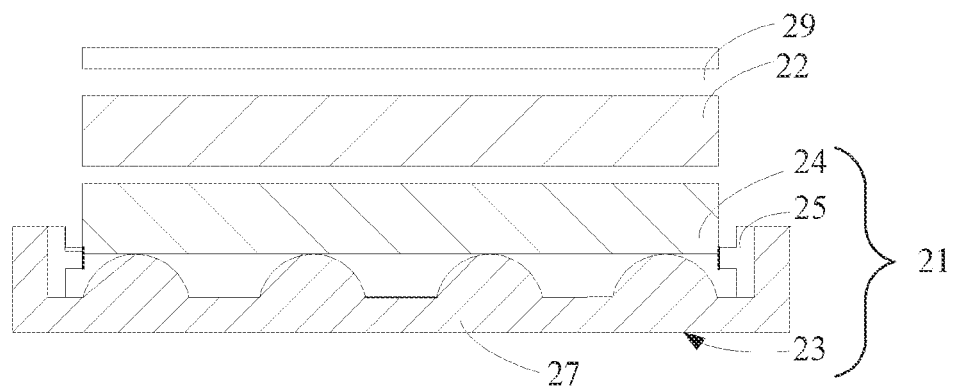
FIG. 17 is a schematic view showing a preferred embodiment of a flat panel display device with a touch screen according to the present invention.

As shown in FIG. 17, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. The back frame 23 forms raised bumps and the light homogenization mechanism 24 is positioned on the bumps. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is noted that the flat panel display device 20 of the present invention can be a liquid crystal display device or a liquid crystal television.

Figure 18:
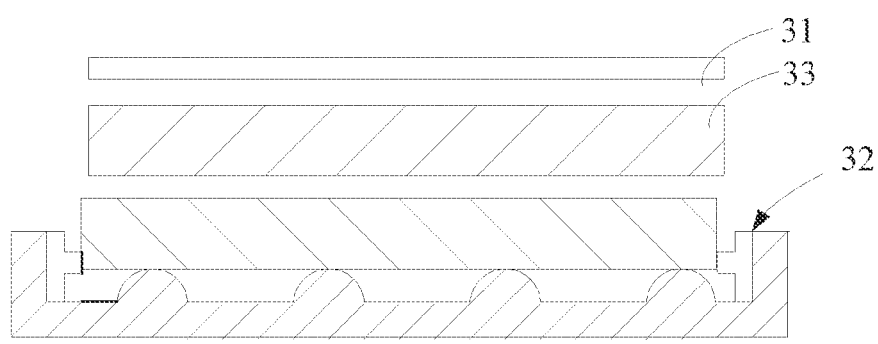
FIG. 18 is a schematic view showing a preferred embodiment of a stereoscopic display device according to the present invention.

The present invention also provides a stereoscopic display device 30, as shown in FIG. 18. The stereoscopic display device 30 comprises a liquid crystal lens grating 31, a backlight system 32, and a display panel 33. The liquid crystal lens grating 31 is arranged on a light exit surface of the display panel 33. The backlight system 32 can be a backlight system of one of the above discussed embodiments, such as the backlight system 32 comprising a back frame, which is similar to the back frame 23 shown in FIG. 2. The back frame forms raised bumps and a light homogenization mechanism, which is similar to the light homogenization mechanism 24 shown in FIG. 2 is positioned on the bumps. The back frame comprises at least first primary assembling piece and the second primary assembling piece. The at least first and second primary assembling pieces form a main frame structure of the back frame. Repeated description will be omitted herein. The back frame carries a light source, which is similar to the light source 25 shown in FIG. 2 and the light homogenization mechanism and the light homogenization mechanism guides the light from the light source to a light incidence surface of the display panel 33.

Figure 19:
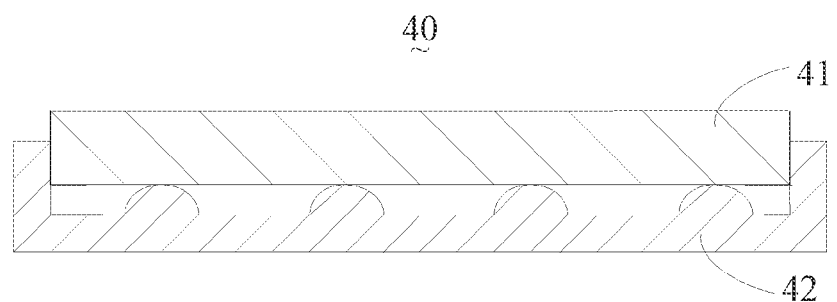
FIG. 19 is a schematic view showing a preferred embodiment of a plasma display device according to the present invention.
Figure 20:
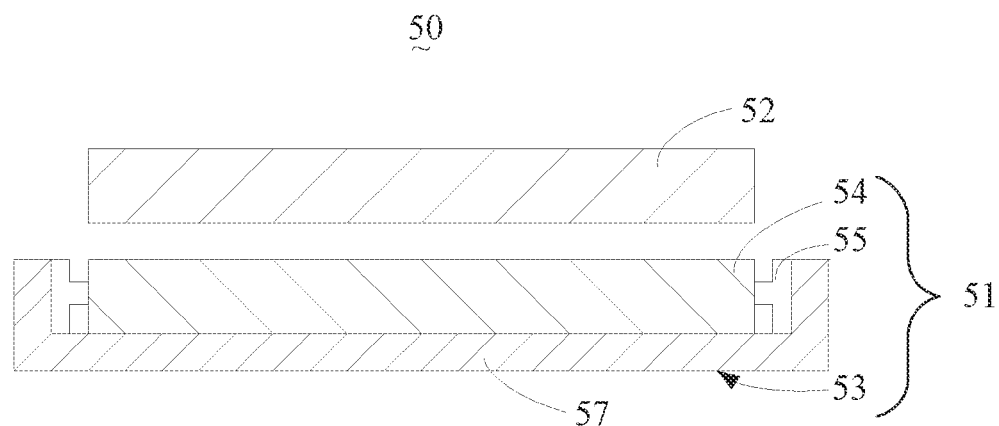
FIG. 20 is a schematic view showing a conventional backlight system.

The present invention also provides a plasma display device 40, as shown in FIG. 19. The plasma display device 40 comprises a plasma display panel 41 and a back frame 42. The back frame 42 is arranged at a back side of the display panel 41. The back frame 42 can be the back frame of any of the previous embodiments and the back frame 42 forms raised bumps and the display panel 41 is positioned on the bumps. Repeated description will be omitted herein. The back frame 42 carries a heat source and a light homogenization mechanism. The light homogenization mechanism guides light from the heat source to a light incidence surface of the display panel 41. The heat source referred to here comprises a circuit board and a power source.

The present invention also provides a backlight system. The backlight system comprises a light source, a light homogenization mechanism, and a back frame. The back frame carries the light source and the light homogenization mechanism. The light source and/or the light homogenization mechanism are positioned on the bumps of the back frame.

With the above discussed manners, the present invention provides a flat panel display device, a stereoscopic display device, and a plasma display device that use at leas two primary assembling pieces and the at least two primary assembling pieces are joined to form a main frame structure of the back frame. The back frame further comprises secondary assembling pieces arranged inside the main frame structure and the secondary assembling pieces are joined to the main frame structure. With bumps formed on the primary assembling pieces and/or the secondary assembling pieces, the back frame can firmly support the light homogenization mechanism, making the structure of backlight system more stable. Further, molds for the back frame and backlight system of the flat panel display device are made simple in structure to thereby reduce the expenditure for mold of back frame, save the material used for back frame is saved, and lower down the cost of the flat panel display device.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A flat panel display device, comprising a display panel and a backlight system comprising a light source, a light homogenization mechanism, and a back frame; wherein the back frame carries the light source and the light homogenization mechanism and the back frame comprises at least first and second primary assembling pieces, wherein the first primary assembling piece has an end forming at least two joint sections, each of the joint sections having a structure mating an end of the second primary assembling piece, the first primary assembling piece using one of the joint sections to join the corresponding end of the second primary assembling piece such that the corresponding end of the second primary assembling piece is selectively mounted to one of the joint sections of the first primary assembling piece, and other joint sections of the first primary assembling piece are idle, the first and second primary assembling pieces being joined to form a main frame structure of the back frame, the back frame further comprising secondary assembling pieces that are arranged inside the main frame structure, the secondary assembling pieces being joined to the main frame structure, at least one of the primary assembling pieces and the secondary assembling pieces forming bumps, the bumps being arranged to receive the light homogenization mechanism to be positioned thereon and supported thereby.

2. The flat panel display device as claimed in claim 1, wherein:
the at least two joint sections are arranged to space from each other in a lengthwise direction of the first primary assembling piece.

3. The flat panel display device as claimed in claim 2, wherein:
the joint sections comprise recesses formed in a surface of the first primary assembling piece and having a shape corresponding to the end of the second primary assembling piece for receiving the end of the second primary assembling piece.

4. The flat panel display device as claimed in claim 2, wherein:
the joint sections comprise recesses formed in a surface of the first primary assembling piece, the second primary assembling piece having a surface forming protrusions at corresponding positions, the protrusions being receivable in the recesses to join the first primary assembling piece and the second primary assembling piece to each other.

5. The flat panel display device as claimed in claim 4, wherein:
the second primary assembling piece has an end forming at least two protrusions that are arranged to space from each other in a lengthwise direction of the second primary assembling piece.

6. The flat panel display device as claimed in claim 4, wherein:
the recess comprises a polygonal recess and the protrusion is shaped as a corresponding polygonal protrusion.

7. The flat panel display device as claimed in claim 3, wherein:
the recess of the first primary assembling piece forms in a bottom thereof a first through hole, the second primary assembling piece forming in a corresponding location a second through hole, the back frame comprising a fastener, the fastener extending through the first through hole and the second through hole to join the first primary assembling piece and the second primary assembling piece to each other.

8. The flat panel display device as claimed in claim 1, wherein:
the back frame comprises a third primary assembling piece and a fourth primary assembling piece; and
the first primary assembling piece, the second primary assembling piece, the third primary assembling piece, and the fourth primary assembling piece are straight linear and are joined to each other in a leading end-to-tailing end manner to form a main frame structure enclosing the back frame.

9. The flat panel display device as claimed in claim 8, wherein:
the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

10. The flat panel display device as claimed in claim 9, wherein the first primary assembling piece and the third primary assembling piece have surfaces forming, in an equally-spaced manner, at least two of the bumps, the bumps of the first primary assembling piece and the third primary assembling piece being arranged symmetrically.

11. The flat panel display device as claimed in claim 9, wherein the secondary assembling pieces have surfaces forming, in an equally-spaced manner, at least two of the bumps, the bumps of the first secondary assembling piece and the second secondary assembling piece being arranged symmetrically.

12. The flat panel display device as claimed in claim 10, wherein:
the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

13. The flat panel display device as claimed in claim 9, wherein:
the second primary assembling piece, the fourth primary assembling piece, the first secondary assembling piece, and the second secondary assembling piece are arranged parallel to each other.

14. The flat panel display device as claimed in claim 1, wherein the flat panel display device comprises a touch screen, the touch screen being positioned on a light exit surface of the display panel.

15. A stereoscopic display device,
comprising a liquid crystal lens grating, a backlight system, and a display panel, the liquid crystal lens grating being arranged on a light exit surface of the display panel; wherein
the backlight system comprises a light source, a light homogenization mechanism, and a back frame;
the back frame carries the light source and the light homogenization mechanism, the light homogenization mechanism guiding light from the light source to a light incidence surface of the display panel; and
the back frame comprises at least first and second primary assembling pieces, wherein the first primary assembling piece has an end forming at least two joint sections, each of the joint sections having a structure mating an end of the second primary assembling piece, the first primary assembling piece using one of the joint sections to join the corresponding end of the second primary assembling piece such that the corresponding end of the second primary assembling piece is selectively mounted to one of the joint sections of the first primary assembling piece, and other joint sections of the first primary assembling piece are idle, the first and second primary assembling pieces being joined to form a main frame structure of the back frame, the back frame further comprising secondary assembling pieces that are arranged inside the main frame structure, the secondary assembling pieces being joined to the main frame structure, at least one of the primary assembling pieces and the secondary assembling pieces forming bumps, the bumps being arranged to receive the light homogenization mechanism to be positioned thereon and supported thereby.

16. The stereoscopic display device as claimed in claim 15, wherein:
the back frame further comprises a third primary assembling piece and a fourth primary assembling piece; and
the first primary assembling piece, the second primary assembling piece, the third primary assembling piece, and the fourth primary assembling piece are jointed to form a main frame structure of the back frame.

17. A plasma display device,
comprising a plasma display panel and a back frame, the back frame being arranged at a back side of the plasma display panel; wherein
the back frame comprises at least first and second primary assembling pieces, wherein the first primary assembling piece has an end forming at least two joint sections, each of the joint sections having a structure mating an end of the second primary assembling piece, the first primary assembling piece using one of the joint sections to join the corresponding end of the second primary assembling piece such that the corresponding end of the second primary assembling piece is selectively mounted to one of the joint sections of the first primary assembling piece, and other joint sections of the first primary assembling piece are idle, the first and second primary assembling pieces being joined to form a main frame structure of the back frame, the back frame further comprising secondary assembling pieces that are arranged inside the main frame structure, the secondary assembling pieces being joined to the main frame structure, at least one of the primary assembling pieces and the secondary assembling pieces forming bumps, the bumps being arranged to receive a light homogenization mechanism to be positioned thereon and supported thereby.

18. The plasma display device as claimed in claim 17, wherein:
the back frame further comprises a third primary assembling piece and a fourth primary assembling piece; and
the first primary assembling piece, the second primary assembling piece, the third primary assembling piece, and the fourth primary assembling piece are jointed to form a main frame structure of the back frame.

* * * * *